(12) United States Patent
Kumai

(10) Patent No.: US 11,969,801 B2
(45) Date of Patent: Apr. 30, 2024

(54) COATED TOOL AND CUTTING TOOL

(71) Applicant: KYOCERA CORPORATION, Kyoto (JP)

(72) Inventor: Kenji Kumai, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 18/001,715

(22) PCT Filed: Jun. 23, 2021

(86) PCT No.: PCT/JP2021/023784
§ 371 (c)(1),
(2) Date: Dec. 14, 2022

(87) PCT Pub. No.: WO2022/004522
PCT Pub. Date: Jan. 6, 2022

(65) Prior Publication Data
US 2023/0234142 A1 Jul. 27, 2023

(30) Foreign Application Priority Data
Jun. 30, 2020 (JP) .................. 2020-112956

(51) Int. Cl.
*B23B 27/14* (2006.01)
*C23C 16/34* (2006.01)
*C23C 16/40* (2006.01)

(52) U.S. Cl.
CPC ............ *B23B 27/148* (2013.01); *C23C 16/34* (2013.01); *C23C 16/403* (2013.01); *B23B 2228/105* (2013.01)

(58) Field of Classification Search
CPC .................................................. B23B 27/148
See application file for complete search history.

(56) References Cited

U.S. PATENT DOCUMENTS 4,643,620 A * 2/1987 Fujii .................. B23P 15/30
407/119
2009/0226715 A1 9/2009 Lev et al.

FOREIGN PATENT DOCUMENTS

JP 4739235 B2 8/2011

* cited by examiner

*Primary Examiner* — Ian A Rummel
(74) *Attorney, Agent, or Firm* — HAUPTMAN HAM, LLP

(57) ABSTRACT

A coated tool in a non-limiting embodiment of the present disclosure includes a base and a coating layer located on the base. The coated tool includes a first surface, a second surface adjacent to the first surface, and a cutting edge located on at least a part of a ridge part of the first surface and the second surface. The coating layer includes a Ti-based coating layer. If a fracture toughness value of the Ti-based coating layer is measured on a surface of the coating layer parallel to a surface of the base, the Ti-based coating layer includes a first region where the fracture toughness value is 10 MPa·m$^{0.5}$ or more.

7 Claims, 4 Drawing Sheets

COATED TOOL AND CUTTING TOOL

CROSS-REFERENCE TO RELATED APPLICATION

The present application is a National Phase of International Application No. PCT/JP2021/023784 filed Jun. 23, 2021, which claims priority to Japanese Patent Application No. 2020-112956, filed Jun. 30, 2020. The contents of applications are incorporated herein by reference in their entirety.

TECHNICAL FIELD

The present disclosure relates to a coated tool and a cutting tool including the coated tool.

BACKGROUND

A coated tool for use in a cutting tool or the like includes a coating layer on a base. The coating layer is deposited by CVD method or PVD method. Examples of the coating layer deposited by CVD method include a coating layer in which a TiN layer, a TiCN layer and an $Al_2O_3$ layer are sequentially laminated one upon another on the base.

The coating layer deposited by CVD method may have large residual stress. Ceramic particles have been projected to the coating layer in order to relax the residual stress.

For example, Japanese Patent No. 4739235 (Patent Document 1) describes that a coating layer is subjected to a blasting process using ceramic abrasive grains.

SUMMARY

A coated tool in a non-limiting embodiment of the present disclosure includes a base and a coating layer located on the base. The coated tool includes a first surface, a second surface adjacent to the first surface, and a cutting edge located on at least a part of a ridge part of the first surface and the second surface. The coating layer includes a Ti-based coating layer. If a fracture toughness value of the Ti-based coating layer is measured on a surface of the coating layer parallel to a surface of the base, the Ti-based coating layer includes a first region where the fracture toughness value is 10 MPa·m$^{0.5}$ or more.

EMBODIMENT

<Coated Tools>

Figure 1:
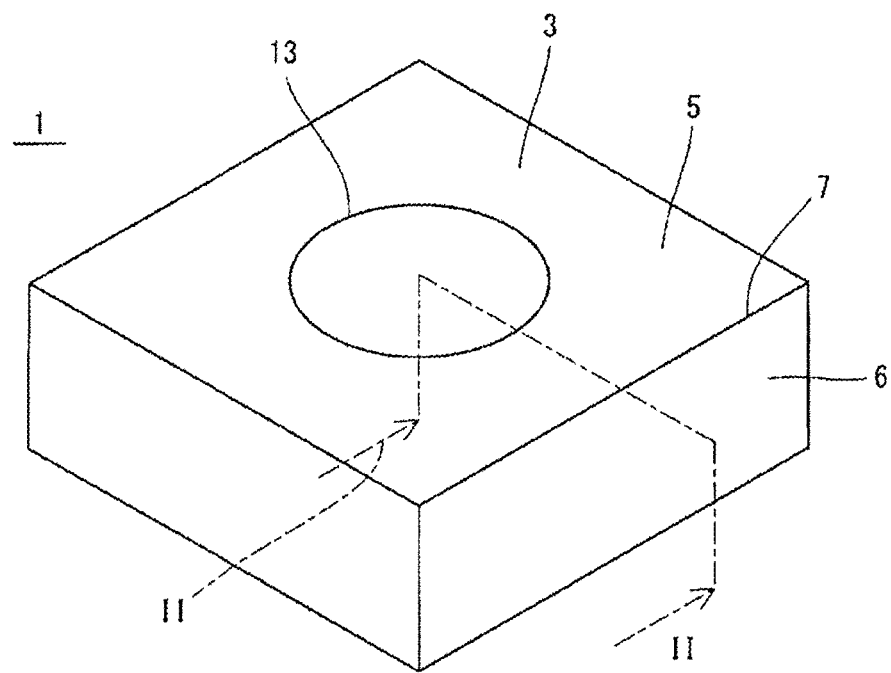
FIG. 1 is a perspective view illustrating a coated tool in a non-limiting embodiment of the present disclosure.

A coated tool 1 in a non-limiting embodiment of the present disclosure is described in detail below with reference to the drawings. For the convenience of description, the drawings referred to in the following illustrate, in simplified form, only main members necessary for describing the embodiments. The coated tool 1 may therefore include any arbitrary structural member not illustrated in the drawings referred to. Dimensions of the members in each of the drawings faithfully represent neither dimensions of actual structural members nor dimensional ratios of these members.

Figure 2:
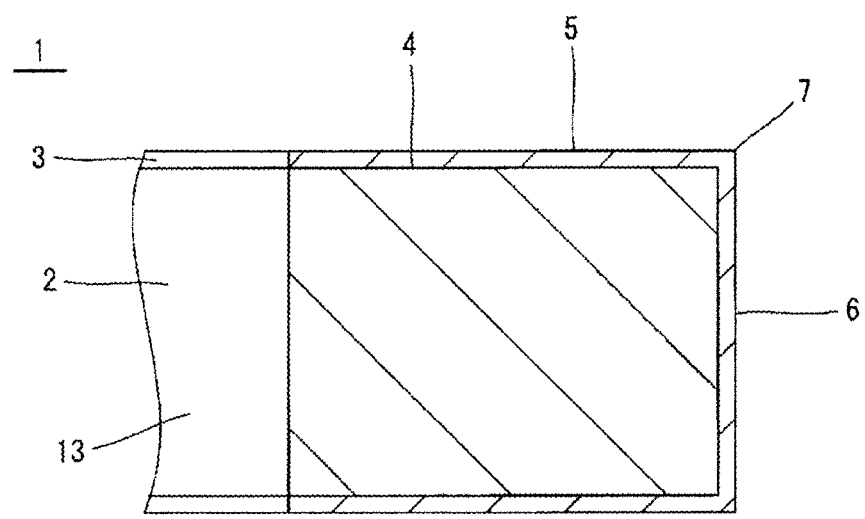
FIG. 2 is a sectional view of a cross section taken along line II-II in the coated tool illustrated in FIG. 1.
Figure 3:
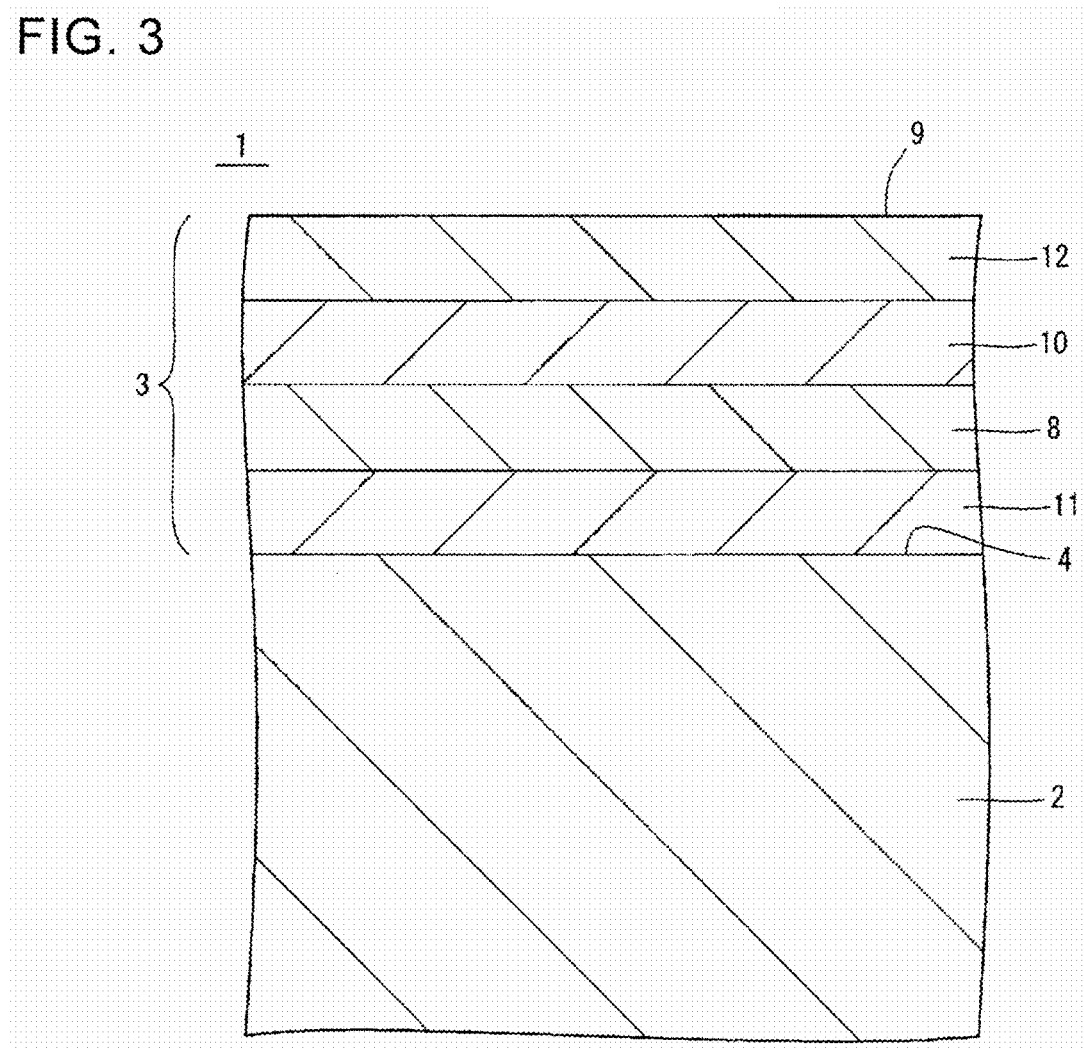
FIG. 3 is an enlarged view of a region in the vicinity of a coating layer in the coated tool illustrated in FIG. 2.

FIGS. 1 to 3 illustrate, as an embodiment of the coated tool 1, a cutting insert applicable to a cutting tool. The coated tool 1 is applicable to, besides cutting tools, wear resistant parts such as sliding parts and metal molds, digging tools, tools such as blades, and impact resistant parts. Applications of the coated tool 1 are not limited to those exemplified above.

The coated tool 1 may include a base 2 and a coating layer 3 located on the base 2.

Examples of material of the base 2 may include hard alloys, ceramics and metals. Examples of the hard alloys may include cemented carbides in which a hard phase composed of WC (tungsten carbide) and, if desired, at least one kind selected from the group consisting of carbide, nitride and carbonitride of group 4, group 5 and group 6 metals in the periodic table other than WC is bonded by a binding phase composed of an iron group metal such as Co (cobalt) or Ni (nickel). Other hard alloys may be Ti-based cermet. The ceramics may be, for example, $Si_3N_4$ (silicon nitride), $Al_2O_3$ (aluminum oxide), diamond and cBN (cubic boron nitride). The metals may be, for example, carbon steel, high-speed steel and alloy steel. The material of the base 2 is however not limited to those exemplified above.

The coating layer 3 may cover the whole or a part of a surface 4 of the base 2. If the coating layer 3 covers only the part of the surface 4 of the base 2, it may be said that the coating layer 3 is located on at least the part of the base 2.

The coating layer 3 may be deposited by chemical vapor deposition (CVD) method. In other words, the coating layer 3 may be a CVD film.

The coating layer 3 is not limited to a specific thickness. A thickness of the coating layer 3 may be set to, for example, 1-30 μm. The thickness and structure of the coating layer 3, and shapes of crystals constituting the coating layer 3 may be measured by, for example, a cross-section observation with an electron microscope. Examples of the electron microscope may include Scanning Electron Microscope (SEM), and Transmission Electron Microscope (TEM).

The coated tool 1 may include a first surface 5 (upper surface), a second surface 6 (lateral surface) adjacent to the first surface 5, and a cutting edge 7 located on at least a part of a ridge part of the first surface 5 and the second surface 6 as in a non-limiting embodiment illustrated in FIGS. 1 and 2.

The first surface 5 may be a rake surface. The whole or a part of the first surface 5 may be the rake surface. For example, a region extending along the cutting edge 7 in the first surface 5 may be the rake surface.

The second surface 6 may be a flank surface. The whole or a part of the second surface 6 may be the flank surface. For example, a region extending along the cutting edge 7 in the second surface 6 may be the flank surface.

The cutting edge 7 may be located on a part or the whole of the ridge part. The cutting edge 7 is usable for cutting out a workpiece.

The coated tool 1 may have a quadrangular plate shape as in the non-limiting embodiment illustrated in FIG. 1. The shape of the coated tool 1 is not limited to the quadrangular plate shape. For example, the first surface 5 may have a triangular shape, a pentagonal shape, a hexagonal shape, or a circular shape. The coated tool 1 may have a columnar shape.

The coated tool 1 is not limited to a specific size. For example, a length of one side of the first surface 5 may be set to approximately 3-20 mm. A height from the first surface 5 to a surface (lower surface) located on a side opposite to the first surface 5 may be set to approximately 5-20 mm.

The coating layer 3 may include a Ti-based coating layer 8 as in a non-limiting embodiment illustrated in FIG. 3.

The Ti-based coating layer 8 may be a layer including TiCN particles or, alternatively, TiC particles or TiN particles. The Ti-based coating layer 8 may be a layer including TiCN as a main ingredient. The term "main ingredient" may denote an ingredient having the largest value of mass % in comparison to other ingredients. These points are also true for other layers.

The Ti-based coating layer 8 may include a first region. The first region may have a fracture toughness value of 10 $MPa \cdot m^{0.5}$ or more. The fracture toughness value may be a value obtained by measuring the fracture toughness value of the Ti-based coating layer 8 on a surface 9 of the coating layer 3 parallel to the surface 4 of the base 2.

As used herein, the term "parallel" is not limited to be a strictly parallel, but it may denote that an inclination of approximately ±10° is permissible. The fracture toughness value may be measured by conducting an indentation test using a nano indenter on a mirror finished surface, and by observing cracks on an obtained indentation with a Field Emission-type Scanning Electron Microscope (FE-SEM). Mirror polishing may be carried out using one in which a diamond paste having a mean particle diameter of 1-3 μm manufactured by Tomei Diamond Co., Ltd. and olive oil manufactured by Yamakei Sangyo Co., Ltd. are controlled so that a paste concentration can be 20-30 mass %. The measurement may be made using, for example, Nanoindentation Tester ENT-1100b/a manufactured by ELIONIX INC. as the nano indenter. An indentation load may be 700 mN, and an indenter used for the measurement may be Berkovich indenter ENT-20-13 manufactured by TOYO Corporation. The fracture toughness value may be measured according to JIS R 1607:2015. The cracks may be observed with JSM-7100F manufactured by JEOL Ltd.

If the Ti-based coating layer 8 includes the first region, the coating layer 3 is less prone to fracture, thus leading to excellent fracture resistance. The whole or a part of the Ti-based coating layer 8 may be composed of the first region. Hereinafter, the fracture toughness value in the first region is referred to as a first fracture toughness value. An upper limit value of the first fracture toughness value may be 20 $MPa \cdot m^{0.5}$.

The Ti-based coating layer 8 may include the first region in each of the first surface 5 and the second surface 6. With this configuration, the first surface 5 and the second surface 6 are less prone to fracture.

The Ti-based coating layer 8 may include a second region. The Ti-based coating layer 8 in the coated tool 1 need not have high fracture toughness in all regions thereof. For example, the second region may be located in a region not involved in cutting, or a region which is involved in cutting but not subjected to large force or impact. As used herein, the region not involved in cutting may be a region located 1 mm or more away from the cutting edge 7 in directions of the first surface 5 and the second surface 6. The second region may have a fracture toughness value of less than 10 $MPa \cdot m^{0.5}$. The fracture toughness value may be a value obtained by measuring a fracture toughness value of the Ti-based coating layer 8 on the surface 9 of the coating layer 3 parallel to the surface 4 of the base 2.

The first region in the present disclosure is obtainable, for example, through a blasting process step using spherical ceramic powder having predetermined hardness. The blasting process step may use so-called dry blasting or wet blasting. The wet blasting has an advantage of having excellent handling properties of the ceramic powder.

If the Ti-based coating layer 8 includes the first region and the second region, it is possible to reduce time spent on the blasting step, thereby reducing manufacturing costs of the coated tool 1. Hereinafter, the fracture toughness value in the second region is referred to as a second fracture toughness value. A lower limit value of the second fracture toughness value may be 1.5 $MPa \cdot m^{0.5}$.

If hardness of the first region is first hardness and hardness of the second region is second hardness, the first hardness may be larger than the second hardness. With this configuration, the coated tool 1 has high wear resistance.

The first hardness and the second hardness are not limited to a specific value. For example, the first hardness may be set to approximately 15-30 GPa. The second hardness may be set to 10-30 GPa. For example, the first hardness and the second hardness may be measured by the indentation test using the nano indenter as in the measurement of the fracture toughness value of the Ti-based coating layer 8. For example, the measurement may be made using Nanoindentation Tester ENT-1100b/a manufactured by ELIONIX INC. as the nano indenter. An indentation load may be 700 mN, and an indenter used for the measurement may be Berkovich indenter ENT-20-13 manufactured by TOYO Corporation.

The Ti-based coating layer 8 may include the first region in the first surface 5 and the second region in the second surface 6. With this configuration, the coated tool 1 has enhanced wear resistance and fracture resistance.

The coating layer 3 may include an $Al_2O_3$ layer 10 on the Ti-based coating layer 8. The $Al_2O_3$ layer 10 may be a layer including $Al_2O_3$ particles. Alternatively, the $Al_2O_3$ layer 10 may be a layer including $Al_2O_3$ layer as a main ingredient.

The $Al_2O_3$ layer 10 may include a third region. The third region may have a fracture toughness value of 5 $MPa \cdot m^{0.5}$ or more. The fracture toughness value may be a value obtained by measuring a fracture toughness value of the $Al_2O_3$ layer 10 on the surface 9 of the coating layer 3 parallel to the surface 4 of the base 2.

If the $Al_2O_3$ layer 10 includes the third region, the coating layer 3 is less prone to fracture, thus leading to excellent fracture resistance. The whole or a part of the $Al_2O_3$ layer 10 may be composed of the third region. Hereinafter, the fracture toughness value in the third region is referred to as a third fracture toughness value. An upper limit value of the third fracture toughness value may be 10 $MPa \cdot m^{0.5}$.

The $Al_2O_3$ layer 10 may include a fourth region. The $Al_2O_3$ layer 10 in the coated tool 1 need not have high fracture toughness in all regions thereof. For example, the fourth region may be located in a region not involved in cutting, or a region which is involved in cutting but not subjected to large force or impact. As used herein, the region not involved in cutting may be a region located 1 mm or more away from the cutting edge 7 in directions of the first surface 5 and the second surface 6. The fourth region may have a fracture toughness value of less than 5 $MPa \cdot m^{0.5}$. The fracture toughness value may be a value obtained by measuring a fracture toughness value of the $Al_2O_3$ layer 10 on the surface 9 of the coating layer 3 parallel to the surface 4 of the base 2.

The third region in the present disclosure is obtainable, for example, through a blasting process step using spherical ceramic powder having predetermined hardness. The blasting process step may use so-called dry blasting or wet blasting. The wet blasting has an advantage of having excellent handling properties of the ceramic powder.

If the $Al_2O_3$ layer 10 includes the third region and the fourth region, it is possible to reduce time spent on the blasting process step, thereby reducing manufacturing costs of the coated tool 1. Hereinafter, the fracture toughness value in the fourth region is referred to as a fourth fracture toughness value. A lower limit value of the fourth fracture toughness value may be 0.3 $MPa \cdot m^{0.5}$.

If hardness of the third region is third hardness and hardness of the fourth region is fourth hardness, the fourth hardness may be larger than the third hardness. With this configuration, the coated tool 1 has high wear resistance.

The third hardness and the fourth hardness are not limited to a specific value. For example, the third hardness may be set to approximately 10-30 GPa. The fourth hardness may be set to 15-30 GPa. For example, the third hardness and the fourth hardness may be measured in the same manner as in the first hardness and the second hardness.

The first region may be located under the third region, and the second region may be located under the fourth region. This leads to enhanced fracture resistance and contributes to reducing time spent on the blasting process step, thereby reducing manufacturing costs of the coated tool 1.

A half width of a (104) plane of the $Al_2O_3$ layer 10 may be 0.15° or more in an X-ray diffraction. With this configuration, the coating layer 3 is less prone to fracture, thus leading to excellent fracture resistance. The half width of the (104) plane of the $Al_2O_3$ layer 10 may be measured as follows. The (104) plane may be based on JCPDS card No. 00-010-0173. If the $Al_2O_3$ layer 10 is exposed by the wet blasting process, an XRD measurement may be made with a mirror surface obtained by mirror polishing of an exposed surface of the $Al_2O_3$ layer 10. Unless the $Al_2O_3$ layer 10 is exposed, the mirror polishing process may be continued until the $Al_2O_3$ layer 10 is exposed, and the XRD measurement may be made with an exposed mirror surface of the $Al_2O_3$ layer 10. The XRD measurement of the $Al_2O_3$ layer 10 may be made by selecting a plane with less surface irregularities. The XRD measurement may be made with MiniFlex600 manufactured by Rigaku Corporation. Measurement conditions are as follows. Characteristic X-ray is $CuK\beta$ ray, output is 40 kV and 15 mA, transmission side solar slit is 2.5°, longitudinal restriction slit is 5.0 mm, divergence slit is 0.625°, scattering slit is 8.0 mm, light-receiving side solar slit is 2.5°, light-receiving slit is 13.0 mm, step width is 0.01°, measurement speed is 2.0°/min, and scanning angle is 20-90°. An upper limit value of the half width of the (104) plane of the $Al_2O_3$ layer 10 may be 2.0°.

The coating layer 3 may include a layer other than the Ti-based coating layer 8 and the $Al_2O_3$ layer 10. Examples of other layer may include a TiC layer and a TiN layer. The coating layer 3 may have a configuration in which the TiN layer 11, the Ti-based coating layer 8 and the $Al_2O_3$ layer 10 are sequentially laminated one upon another on the base 2 as in the non-limiting embodiment illustrated in FIG. 3. Alternatively, the coating layer 3 may have a configuration in which a TiN layer 12 or the like may be further laminated on the $Al_2O_3$ layer 10. The $Al_2O_3$ layer 10 may be in contact with the Ti-based coating layer 8. For the sake of convenience, the TiN layer 11 may be called a first TiN layer 11, and the TiN layer 12 may be called a second TiN layer 12.

The thickness of each of the first TiN layer 11, the Ti-based coating layer 8, the $Al_2O_3$ layer 10 and the second TiN layer 12 is not limited to a specific value. For example, the thickness of the first TiN layer 11 may be set to 0.1-3.0 μm. The thickness of the Ti-based coating layer 8 may be set to 1.0-20 μm. The thickness of the $Al_2O_3$ layer 10 may be set to 1.0-20 μm. The thickness of the second TiN layer 12 may be set to 0.1-10 μm.

The coated tool 1 may include a through hole 13. The through hole 13 is usable for attaching, for example, a screw or a clamping member when holding the coated tool 1 in a holder. The through hole 13 may be formed from the first surface 5 to a surface (lower surface) located on a side opposite to the first surface 5. Alternatively, the through hole 13 may open into these surfaces. There is no problem if the through hole 13 is configured to open into regions opposed to each other on the second surface 6.

<Method for Manufacturing Coated Tool>

A method for manufacturing a coated tool in a non-limiting embodiment of the present disclosure is described below by illustrating the case of manufacturing the coated tool 1.

A base 2 may be firstly manufactured. A description is given by illustrating an embodiment where the base 2 composed of a hard alloy is manufactured as the base 2. Firstly, a mixed powder may be prepared by suitably adding metal powder, carbon powder or the like to an inorganic powder of metal carbide, nitride, carbonitride, oxide or the like, with which it is possible to form the base 2 by sintering, and by mixing them together. A molded body may be obtained by molding the mixed powder into a predetermined tool shape with a known molding method, such as press molding, casting molding, extrusion molding, or cold isostatic pressing. Subsequently, the base 2 may be obtained by sintering the obtained molded body in a vacuum or a non-oxidizing atmosphere. A surface 4 of the base 2 may be subjected to polishing process or honing process.

Subsequently, a coating layer 3 may be deposited on the surface 4 of the obtained base 2 by CVD method. The deposited coating layer 3 may be subjected to a wet blasting process. Hereinafter, the coating layer 3 and the coated tool 1 before being subjected to the wet blasting process are respectively referred to as an untreated coating layer and an untreated coated tool. The untreated coating layer and the untreated coated tool after being subjected to the wet blasting process are respectively referred to as the coating layer 3 and the coated tool 1. The step before carrying out the wet blasting process may be referred to as a first step of preparing the untreated coated tool including the untreated coating layer on the base 2.

For example, the first TiN layer 11, the Ti-based coating layer 8 and the $Al_2O_3$ layer 10 may be sequentially deposited on the base 2 as the untreated coating layer. The second TiN layer 12 or the like may be further deposited on the $Al_2O_3$ layer 10.

The first TiN layer 11 may be deposited as follows. Firstly, a mixed gas may be prepared as a reaction gas composition. The mixed gas is composed of 0.1-10 vol % of titanium tetrachloride ($TiCl_4$) gas, 10-60 vol % of nitrogen ($N_2$) gas, and the rest, namely, hydrogen ($H_2$) gas. The first TiN layer 11 may be deposited by loading the mixed gas into a chamber in which a set temperature is 800-1010° C. and a set pressure is 10-85 kPa. These deposition conditions are also applicable to the second TiN layer 12.

The Ti-based coating layer 8 may be deposited as follows. Firstly, a mixed gas may be prepared as a reaction gas composition. The mixed gas is composed of 0.1-10 vol % of titanium tetrachloride (TiCl$_4$) gas, 0.1-3.0 vol % of acetonitrile (CH$_3$CN) gas, and the rest, namely, hydrogen (H$_2$) gas. The Ti-based coating layer 8 may be deposited by loading the mixed gas into the chamber in which a set temperature is 800-1050° C. and a set pressure is 5-30 kPa.

The Al$_2$O$_3$ layer 10 may be deposited as follows. Firstly, a mixed gas may be prepared as a reaction gas composition. The mixed gas is composed of 0.5-5 vol % of aluminum trichloride (AlCl$_3$) gas, 0.5-3.5 vol % of hydrogen chloride (HCl) gas, 0.5-5 vol % of carbon dioxide (CO$_2$) gas, 0.5 vol % or less of hydrogen sulfide (H$_2$S) gas, and the rest, namely, hydrogen (H$_2$) gas. The Al$_2$O$_3$ layer 10 may be deposited by loading the mixed gas into the chamber in which a set temperature is 930-1010° C. and a set pressure is 5-10 kPa.

Subsequently, the deposited untreated coating layer may be subjected to the step of carrying out a wet blasting process. This step may be a second step of causing spherical ceramic particles whose hardness (HV) is 1000 or more to collide with the untreated coating layer. The HV (Vickers hardness) may be measured according to JIS Z 2244:2009. An upper limit value of the hardness (HV) of the spherical ceramic particles may be 2500.

The hardness of media, such as the spherical ceramic particles, may be measured in a hardness measurement by a loading-unloading test. For the hardness measurement, a cured body may be used which is manufactured by mixing the media and an embedding resin, followed by curing a mixed body. A surface of the cured body may be polished, and harness of the media exposed on a polished surface may be measured. For example, Technovit 4004 manufactured by Kulzer GmbH may be used as the embedding resin. The media to be measured and the embedding resin may be mixed at a ratio of 3:1 (mass ratio) to obtain a cured body, and a surface thereof may be polished. After polishing, a hardness measurement may be made on a part of the cured body where the media are exposed. The measurement may be made with Dynamic Ultra Micro Hardness Tester DUH-211S. The measurement may be made under conditions where a measuring indenter is 115° in angle between ridges and is a conical indenter (made of diamond), a test force is 49 mN, a load speed is 2.665 mN/sec, and holding time is 5 seconds. The number of measurements is 10 points, and an average value thereof may be determined.

The second step may be carried out on the whole or a part of the surface of the untreated coating layer. The Ti-based coating layer 8 tends to include the first region and the Al$_2$O$_3$ layer 10 tends to include the third region in a region of the untreated coating layer after being subjected to the second step. The Ti-based coating layer 8 tends to include the second region, and the Al$_2$O$_3$ layer 10 tends to include the fourth region in a region of the untreated coating layer not subjected to the second step.

In the wet blasting process, a blasting solution including the spherical ceramic particles in a liquid may be projected to the untreated coating layer. The blasting solution is also called a slurry. For example, water may be used as the liquid.

Figure 4:
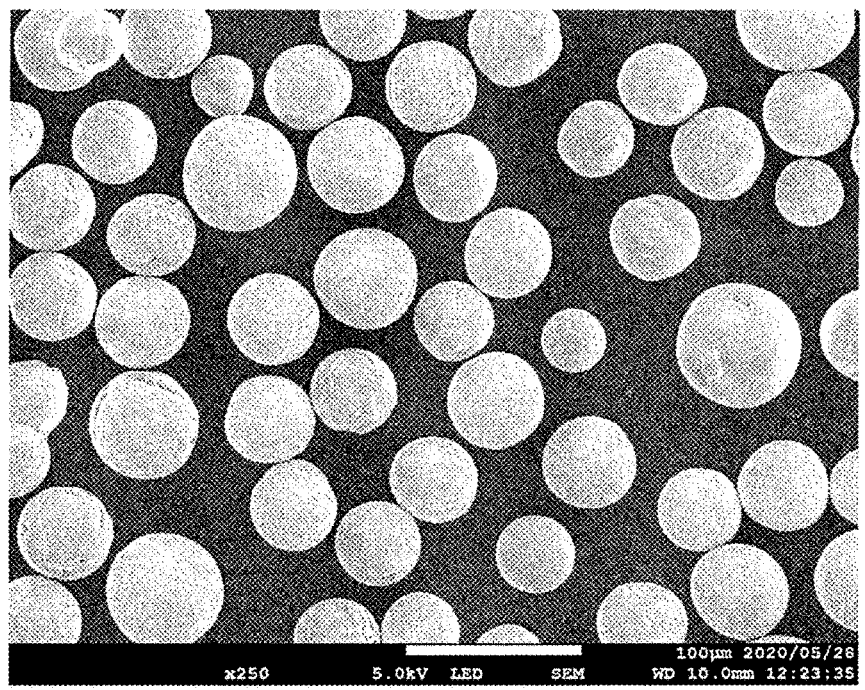
FIG. 4 is an electron microscope (SEM) photograph of spherical ceramic particles.
Figure 5:
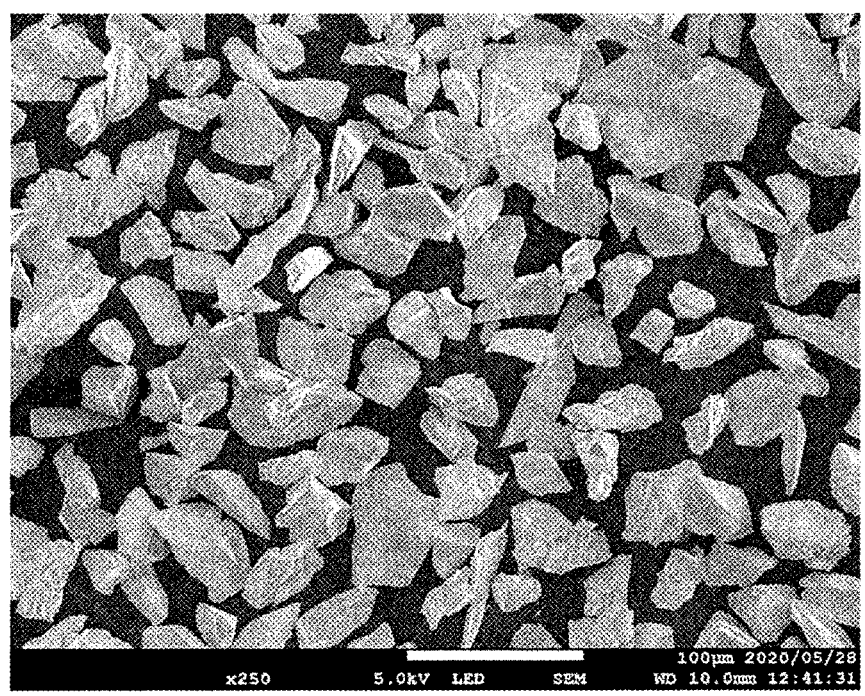
FIG. 5 is an electron microscope (SEM) photograph of angular ceramic particles.

The spherical ceramic particles may denote ones which are not obtained by pulverizing a raw material. In order to distinguish from the spherical ceramic particles, ceramic particles obtained by pulverizing the raw material may be referred to as angular ceramic particles. FIG. 4 illustrates a photograph of the spherical ceramic particles. FIG. 5 illustrates a photograph of the angular ceramic particles. The spherical ceramic particles may have a specific gravity of 6 g/cm$^3$ or less. The spherical ceramic particles having a specific gravity of 6 g/cm$^3$ or less are relatively likely to be dispersed in water because of the small specific gravity, and therefore are suitable for the wet blasting. For example, Al$_2$O$_3$ particles have a specific gravity of approximately 4 g/cm$^3$.

The angular ceramic particles may have irregular shapes and may include corners as in the photograph illustrated in FIG. 5. The angular ceramic particles may be ones which are manufactured, for example, by pulverizing raw material particles, or may be ones in which fracture surfaces and corners are formed in the pulverization step. The angular ceramic particles are used in a conventional wet blasting process.

Meanwhile, the spherical ceramic particles may have an almost spherical shape without corners as in the photograph illustrated in FIG. 4. The shape of the spherical ceramic particles need not be a true sphere. A small deformation from a sphere is permissible if there is neither fracture surfaces nor acute corners.

As one whose shape is similar to that of the spherical ceramic particles, there may be spherical metal particles. The spherical metal particles have the shape similar to that of the spherical ceramic particles, but have a larger specific gravity and are softer than the spherical ceramic particles. For example, the specific gravity of the spherical metal particles is 7-8 g/cm$^3$. Hardness (HV) of the spherical metal particles is less than 1000. Although it seems to arise from these characteristics, it is difficult to obtain the coated tool 1 including the first region or the third region if using the spherical metal particles. Further, the spherical metal particles are less likely to be dispersed in water due to the large specific gravity, thus being unsuitable for the wet blasting.

For similar reasons, even with the spherical ceramic particles, it is difficult to obtain the coated tool 1 including the first region or the third region if including a large amount of glass beads having hardness (HV) of less than 1000, or a large amount of glass ingredients.

Various sizes of spherical ceramic particles are usable in the wet blasting process. If using spherical ceramic particles having a large mean particle diameter, blasting time tends to be reduced. The mean particle diameter of the spherical ceramic particles may be 200 μm or less.

The mean particle diameter of the spherical ceramic particles may be 30-100 μm. If using the spherical ceramic particles in this range, various kinds of untreated coating layers can be subjected to the blasting process with good reproducibility.

The mean particle diameter of the spherical ceramic particles may be measured by laser diffraction method. In cases where the spherical ceramic particles and the angular ceramic particles are mixed together, the blasting solution may be dried, and the spherical ceramic particles may be extracted from a SEM photograph. The mean particle diameter may be an average value of equivalent circle diameters of 100 individual spherical ceramic particles obtainable from the photograph.

An average circularity of the spherical ceramic particles may be 0.82 or more. Especially, the average circularity of the spherical ceramic particles may be 0.88 or more. This leads to enhanced fracture resistance of a coated tool to be manufactured. An upper limit value of the average circularity may be 0.98.

The average circularity may be measured as follows. Firstly, particle images may be photographed with SEM or TEM, and projected areas (S) and circumferential lengths (L) of the particles may be measured with image analysis software (for example, "Mac-View Version. 4" manufactured by MOUNTECH Co., Ltd.). Then, circularity may be calculated by applying an obtained measured value to equation: $4\pi S/L^2$. Circularity of arbitrarily selected 100 particles may be calculated, and an average value thereof may be an average circularity.

Examples of material of the spherical ceramic particles include $Al_2O_3$, $ZrO_2$ and SiC. The average particle diameter may be decreased if using the spherical ceramic particles of a material having a large specific gravity. The average particle diameter may be increased if using the spherical ceramic particles of a material having a small specific gravity.

The blasting solution may be manufactured by incorporating 10-40 vol % of the spherical ceramic particles into water.

Projection conditions of the blasting solution may include a projection pressure of 0.15-0.30 MPa and projection time of 0.4-10.0 seconds. If the projection time of the blasting solution exceeds 10.0 seconds, the untreated coating layer tends to peel off significantly, and therefore this projection time is unsuitable. When projecting the blasting solution to the untreated coating layer, at least a part of the $Al_2O_3$ layer 10 may be left.

The coated tool 1 is manufacturable by going through, for example, the foregoing steps.

The blasting solution may partially include the angular ceramic particles. In such cases, 50 vol % or more of ceramic particles may be the spherical ceramic particles.

A blasting solution including the angular ceramic particles may be projected before projecting a blasting solution including the spherical ceramic particles. Alternatively, the blasting solution including the angular ceramic particles may be projected after projecting the blasting solution including the spherical ceramic particles. A fracture toughness value of the coating layer 3 increased by projecting the blasting solution including the spherical ceramic particles is less likely to decrease even if projecting the blasting solution including the angular ceramic particles.

In cases where the blasting solution including the spherical ceramic particles is projected to the untreated coating layer, for example, a commercially available wet blasting device may be used.

The untreated coating layer may have tensile stress in the untreated coated tool. The tensile stress is not limited to a specific value. An absolute value of the tensile stress may be set to approximately 50-500 MPa.

The untreated coating layer may have compressive stress. The compressive stress is not limited to a specific value. An absolute value of the compressive stress may be set to approximately 50-2000 MPa.

The tensile stress and the compressive stress may be measured by sin 2ψ method using an X-ray stress measurement device (XRD). When measuring residual stress, the $Al_2O_3$ layer 10 may be measured by selecting a (116) plane of α-type $Al_2O_3$. The Ti-based coating layer 8 may be measured by selecting a (422) plane of TiCN.

A region including the cutting edge 7 in the obtained coated tool 1 may be subjected to a polishing process. Consequently, the region including the cutting edge 7 becomes smooth, so that welding of a workpiece can be reduced to enhance fracture resistance of the cutting edge 7.

The above manufacturing method is one embodiment of the method for manufacturing the coated tool 1. Therefore, it should be noted that the coated tool 1 is not limited to one which is manufactured by the above manufacturing method.

<Cutting Tool>

A cutting tool 101 in a non-limited embodiment of the present disclosure is described in detail below by illustrating the case of including the above coated tool 1 with reference to FIG. 6.

Figure 6:
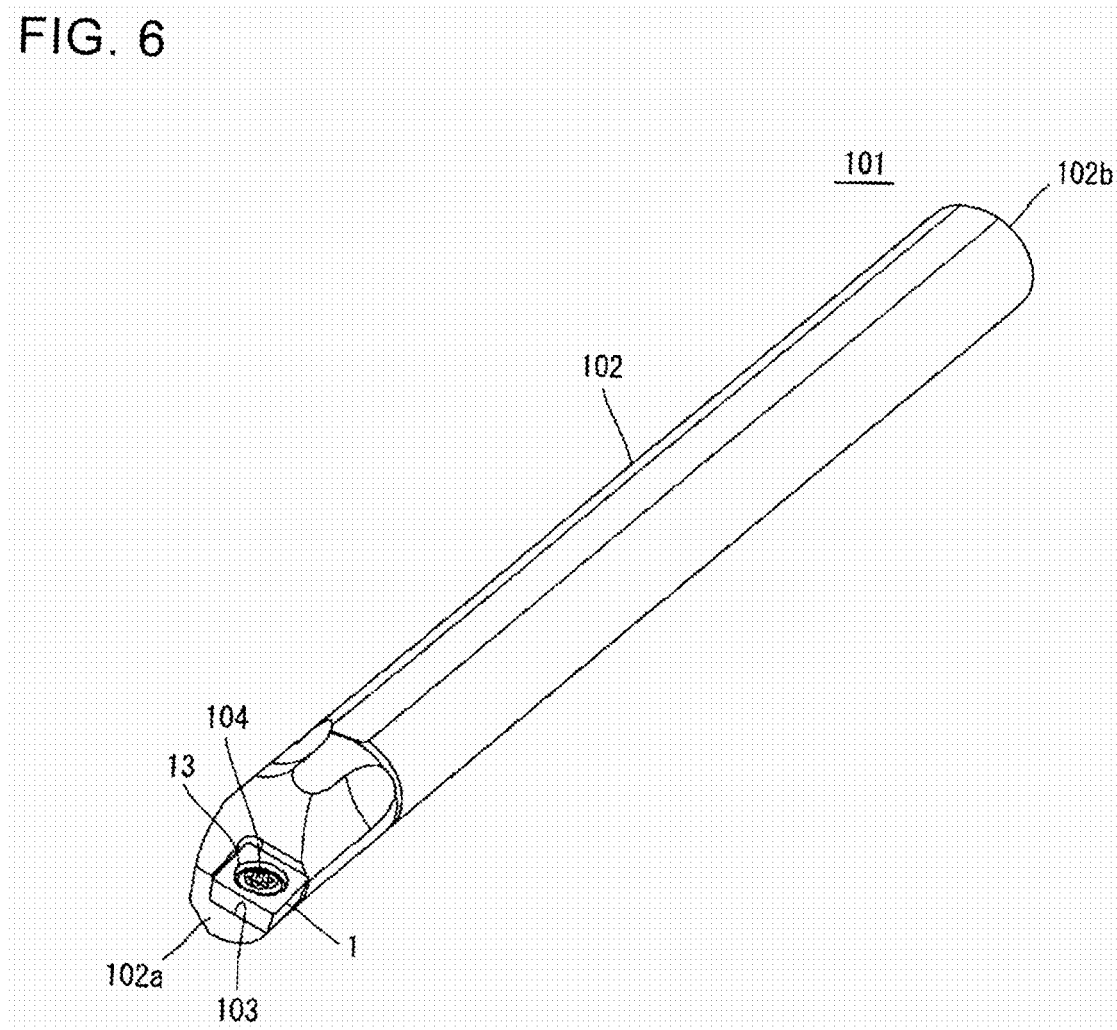
FIG. 6 is a perspective view illustrating a cutting tool in a non-limiting embodiment of the present disclosure.

As in the non-limiting embodiment illustrated in FIG. 6, the cutting tool 101 may include a holder 102 having a length from a first end 102a to a second end 102b and including a pocket 103 located on a side of the first end 102a, and a coated tool 1 located in the pocket 103. If the cutting tool 101 includes the coated tool 1, it is possible to carry out a stable cutting process for a long term because the coated tool 1 is excellent in fracture resistance.

The pocket 103 is a part that permits attachment of the coated tool 1. The pocket 103 may open into an outer peripheral surface and an end surface on a side of the first end 102a in the holder 102.

The coated tool 1 may be attached to the pocket 103 so that the cutting edge 7 can protrude outward from the holder 102. The coated tool 1 may be attached to the pocket 103 with a screw 104. Specifically, the coated tool 1 may be attached to the pocket 103 in such a manner that screw parts are engaged with each other by inserting the screw 104 into a through hole 13 of the coated tool 1, and by inserting a front end of the screw 104 into a screw hole formed in the pocket 103. A sheet may be held between the coated tool 1 and the pocket 103.

For example, steel and cast iron are usable as a material of the holder 102. The holder 102 has enhanced toughness if the material of the holder 102 is steel.

The embodiment illustrated in FIG. 6 exemplifies the cutting tool 101 for use in a so-called turning process. Examples of the turning process include internal diameter processing, external diameter processing and grooving process. The use of the cutting tool 101 is not limited to the turning process. There is no problem if the cutting tool 101 is used in, for example, a milling process.

Although the present disclosure is described in detail below by giving Examples, the present disclosure is not limited to the following Examples.

EXAMPLES

Samples Nos. 1 to 11

(Coated Tool Manufacturing)

Firstly, a base was manufactured. Specifically, 6 mass % of metal Co powder having a mean particle diameter of 1.5 μm, 2.0 mass % of TiC (titanium carbide) powder, and 0.2 mass % of $Cr_3C_2$ (chromium carbide) powder were added in their respective proportions to WC powder having a mean particle diameter of 1.2 μm, and these were mixed together to manufacture a mixed raw material powder. Subsequently, the mixed raw material powder was molded into a cutting tool shape (CNMG120408) by press molding, thereby obtaining a molded body. The obtained molded body was subjected to a debinding process and sintering in a vacuum of 0.5-100 Pa at 1400° C. for one hour, thereby manufacturing a base composed of cemented carbide. A side of the rake surface (first surface) of the manufactured base was subjected to edge treatment (round honing) by brushing.

Subsequently, an untreated coating layer was deposited on the base. Specifically, a first TiN layer, a Ti-based coating layer, an $Al_2O_3$ layer and a second TiN layer were deposited on the base in this order from a side of the base. Deposition conditions and thicknesses were as follows. The thicknesses were values obtained by cross-sectional measurement with SEM.

(First TiN Layer)
$TiCl_4$ gas: 1.0 vol %
$N_2$ gas: 55.0 vol %
$H_2$ gas: the rest
Temperature: 850° C.
Pressure: 16 kPa
Thickness: 1.0 μm
(Ti-Based Coating Layer)
$TiCl_4$ gas: 7.0 vol %
$CH_3CN$ gas: 0.5 vol %
$H_2$ gas: the rest
Temperature: 850° C.
Pressure: 10 kPa
Thickness: 7.0 μm
($Al_2O_3$ Layer)
$AlCl_3$ gas: 4.2 vol %
HCl gas: 0.9 vol %
$CO_2$ gas: 4.5 vol %
$H_2S$ gas: 0.3 vol %
$H_2$ gas: the rest
Temperature: 950° C.
Pressure: 9 kPa
Thickness: 8.0 μm
(Second TiN Layer)
$TiCl_4$ gas: 3.0 vol %
$N_2$ gas: 40.0 vol %
$H_2$ gas: the rest
Temperature: 1010° C.
Pressure: 30 kPa
Thickness: 2.0 μm Subsequently, a blasting solution was prepared as media in such a manner that spherical $Al_2O_3$ particles, spherical particles composed of zircon ($ZrSiO_4$), and angular $Al_2O_3$ particles, each having a mean particle diameter presented in Table 1, and each of which was included in an amount of 25 vol % relative to water. Hardness (HV) of the media was a value measured in the following manner.

(Media Hardness)

The hardness of the media used in the blasting process was measured in a hardness measurement by a loading-unloading test in the following procedure. Firstly, surface polishing was carried out by fixing media to be measured, with an embedding resin (Technovit 4004 manufactured by Kulzer GmbH). The following procedure was taken. Specifically, 3 g of $Al_2O_3$ powder was added to 1 g of resin in which a liquid curing resin and a curing agent were mixed at 3:1 (mass ratio), and these were mixed together. This was cured at room temperature (23° C.) for approximately one hour, thereby obtaining a cured body. Thereafter, the cured body was polished. After the polishing, a hardness measurement was made on a part of the cured body where the media were exposed. The measurement was made with Dynamic Ultra Micro Hardness Tester DUH-2115 under conditions where a measuring indenter was 115° in angle between ridges and was a conical indenter (made of diamond), a test force was 49 mN, a load speed was 2.665 mN/sec, and holding time was 5 seconds. The number of measurements was 10 points, and an average value thereof was determined.

A pressure of compressed air (projection pressure) was set to 0.2 MPa, and the prepared blasting solution was projected to the untreated coating layer for a period of time presented in Table 1, thereby obtaining a coated tool. The blasting solution was projected to a region involved in cutting on the first surface and the second surface. The region involved in the cutting was the region located less than 1 mm away from the cutting edge in directions of the first surface and the second surface.

TABLE 1

| Sample No. | Media material | Hardness (HV) Angular | Hardness (HV) Spherical | Mean particle diameter (μm) Angular | Mean particle diameter (μm) Spherical | Media shape First surface | Media shape Second surface | Processing time (sec) |
|---|---|---|---|---|---|---|---|---|
| 1 | — | — | — | — | — | None | None | — |
| 2 | $Al_2O_3$ | 1600 | — | 50 | — | Angular | Angular | 3.0 |
| 3 | $ZrSiO_4$ | — | 750 | — | 50 | Spherical | Spherical | 3.0 |
| 4 | $ZrSiO_4$ | — | 750 | — | 125 | Spherical | Spherical | 3.0 |
| 5 | $Al_2O_3$ | — | 1600 | — | 20 | Spherical | Spherical | 6.0 |
| 6 | $Al_2O_3$ | — | 1600 | — | 30 | Spherical | Spherical | 6.0 |
| 7 | $Al_2O_3$ | — | 1600 | — | 50 | Spherical | Spherical | 3.0 |
| 8 | $Al_2O_3$ | — | 1600 | — | 70 | Spherical | Spherical | 3.0 |
| 9 | $Al_2O_3$ | — | 1600 | — | 100 | Spherical | Spherical | 1.8 |
| 10 | $Al_2O_3$ | — | 1600 | — | 125 | Spherical | Spherical | 1.8 |
| 11 | $Al_2O_3$ | — | 1600 | — | 70 | Spherical | Spherical | 1.8 |

<Evaluations>

First to fourth fracture toughness values and first to fourth hardness were measured on the obtained coated tools. A half width of a (104) plane in the region involved in the cutting was measured. Further, cutting evaluations of the obtained coated tools were made to evaluate fracture resistance. A measuring method is described below, and the results are presented in Tables 2 and 3.

(First to Fourth Fracture Toughness Values)

The fracture toughness value was measured by conducting an indentation test using a nano indenter on a mirror finished surface, and by observing cracks on an obtained indentation with a Field Emission-type Scanning Electron Microscope (FE-SEM). The measurement was made using Nanoindentation Tester ENT-1100b/a manufactured by ELIONIX INC. as the nano indenter. An indentation load was 700 mN, and an indenter used for the measurement was Berkovich indenter ENT-20-13 manufactured by TOYO Corporation. The fracture toughness value was measured according to JIS R 1607:2015. The cracks were observed with JSM-7100F manufactured by JEOL Ltd.

If the $Al_2O_3$ layer was exposed by the wet blasting process, a fracture toughness value was measured on a mirror surface obtained by mirror polishing a surface of the exposed $Al_2O_3$ layer. If the $Al_2O_3$ layer was not exposed, the mirror polishing process was continued until the $Al_2O_3$ layer was exposed, and a fracture toughness value was measured on an exposed mirror surface of the $Al_2O_3$ layer.

A fracture toughness value of the Ti-based coating layer was also measured by carrying out a mirror polishing until the Ti-based coating layer was exposed on a surface of the coating layer, and by making a measurement on a mirror surface of the exposed Ti-based coating layer.

The mirror polishing was carried out using one in which a diamond paste having a mean particle diameter of 1.4 μm manufactured by Tomei Diamond Co., Ltd. and olive oil manufactured by Yamakei Sangyo Co., Ltd. were controlled so that a paste concentration can be 25 mass %. The mirror polishing was carried out in such a manner that the mirror surface was parallel to the surface of the base.

(First to Fourth Hardness)

Measurements were made by an indentation test using a nano indenter. The nano indenter was Nanoindentation Tester ENT-1100b/a manufactured by ELIONIX INC. An indentation load was 700 mN, and an indenter used for the measurement was Berkovich indenter ENT-20-13 manufactured by TOYO Corporation.

(Half Width of (104) Plane of Region Involved in Cutting)

A half width of the (104) plane of the region involved in the cutting on the surface after being subjected to the wet blasting process was measured. The (104) plane of the $Al_2O_3$ layer was based on JCPDS card No. 00-010-0173. If the $Al_2O_3$ layer was exposed by the wet blasting process, an XRD measurement was made on a mirror surface obtained by mirror polishing of an exposed surface of the $Al_2O_3$ layer. Unless the $Al_2O_3$ layer was exposed, the mirror polishing process was continued until the $Al_2O_3$ layer was exposed, and the XRD measurement was made on an exposed mirror surface of the $Al_2O_3$ layer. The XRD measurement of the $Al_2O_3$ layer was made by selecting a plane with less surface irregularities. The XRD measurement was made with Mini-Flex600 manufactured by Rigaku Corporation. Measurement conditions were as follows. Characteristic X-ray was CuKβ ray, output was 40 kV and 15 mA, transmission side solar slit was 2.5°, longitudinal restriction slit was 5.0 mm, divergence slit was 0.625°, scattering slit was 8.0 mm, light-receiving side solar slit was 2.5°, light-receiving slit was 13.0 mm, step width was 0.01°, measurement speed was 2.0°/min, and scanning angle was 20-90°.

(Cutting Evaluation)

An intermittent cutting test was conducted under the following conditions.

Workpiece: carbon steel for mechanical structure (S45C steel material with 16 grooves)
Tool Shape: CNMG120408
Cutting Speed: 48 m/min
Feed Rate: 0.27 mm/rev
Depth of Cut: 1.0 mm
Others: Using water-soluble coolant
Evaluation Item: Measuring the number of impacts until occurrence of a fracture

TABLE 2

| Sample No. | Region involved in cutting on first surface | Region involved in cutting on second surface | First fracture toughness value (MPa·m$^{0.5}$) First surface | First fracture toughness value (MPa·m$^{0.5}$) Second surface | Second fracture toughness value (MPa·m$^{0.5}$) First surface | Second fracture toughness value (MPa·m$^{0.5}$) Second surface | First hardness (GPa) First surface | First hardness (GPa) Second surface | Second hardness (GPa) First surface | Second hardness (GPa) Second surface | Number of impacts | |
|---|---|---|---|---|---|---|---|---|---|---|---|---|
| 1 | Second region | Second region | — | — | 2.6 | 2.6 | — | — | 19.7 | 19.7 | 2500 | Comparative example |
| 2 | Second region | Second region | — | — | 3.4 | 3.4 | — | — | 19.9 | 19.9 | 9000 | Comparative example |
| 3 | Second region | Second region | — | — | 3.3 | 3.3 | — | — | 20.0 | 20.0 | 9000 | Comparative example |
| 4 | Second region | Second region | — | — | 4.0 | 4.0 | — | — | 20.1 | 20.1 | 11000 | Comparative example |
| 5 | First region | First region | 11.4 | 11.4 | 6.0 | 6.0 | 20.5 | 20.5 | 20.1 | 20.1 | 25000 | Example |
| 6 | First region | First region | 11.7 | 11.7 | 6.2 | 6.2 | 20.4 | 20.4 | 20.2 | 20.2 | 28000 | Example |
| 7 | First region | First region | 11.9 | 11.9 | 6.4 | 6.4 | 20.4 | 20.4 | 20.0 | 20.0 | 30000 | Example |
| 8 | First region | First region | 14.0 | 14.0 | 7.2 | 7.2 | 20.3 | 20.3 | 19.8 | 19.8 | 37000 | Example |
| 9 | First region | First region | 13.6 | 13.6 | 6.8 | 6.8 | 20.6 | 20.6 | 20.1 | 20.1 | 33000 | Example |
| 10 | First region | First region | 13.8 | 13.8 | 7.0 | 7.0 | 20.3 | 20.3 | 19.9 | 19.9 | 35000 | Example |
| 11 | First region | First region | 13.3 | 13.3 | 6.5 | 6.5 | 20.0 | 20.0 | 20.2 | 20.2 | 25600 | Example |

TABLE 3

| Sample No. | Region involved in cutting on first surface | Region involved in cutting on second surface | First fracture toughness value (MPa·m$^{0.5}$) First surface | First fracture toughness value (MPa·m$^{0.5}$) Second surface | Second fracture toughness value (MPa·m$^{0.5}$) First surface | Second fracture toughness value (MPa·m$^{0.5}$) Second surface | First hardness (GPa) First surface | First hardness (GPa) Second surface | Second hardness (GPa) First surface | Second hardness (GPa) Second surface | Half width of (104) plane of region involved in cutting | Number of impacts | |
|---|---|---|---|---|---|---|---|---|---|---|---|---|---|
| 1 | Fourth region | Fourth region | — | — | 0.8 | 0.8 | — | — | 22.3 | 22.3 | 0.08 | 2500 | Comparative example |

TABLE 3-continued

| Sample No. | Region involved in cutting on first surface | Region involved in cutting on second surface | First fracture toughness value (MPa·m$^{0.5}$) First surface | First fracture toughness value (MPa·m$^{0.5}$) Second surface | Second fracture toughness value (MPa·m$^{0.5}$) First surface | Second fracture toughness value (MPa·m$^{0.5}$) Second surface | First hardness (GPa) First surface | First hardness (GPa) Second surface | Second hardness (GPa) First surface | Second hardness (GPa) Second surface | Half width of (104) plane of region involved in cutting | Number of impacts | |
|---|---|---|---|---|---|---|---|---|---|---|---|---|---|
| 2 | Fourth region | Fourth region | — | — | 1.5 | 1.5 | — | — | 22.0 | 22.0 | 0.10 | 9000 | Comparative example |
| 3 | Fourth region | Fourth region | — | — | 1.5 | 1.5 | — | — | 22.0 | 22.0 | 0.10 | 9000 | Comparative example |
| 4 | Fourth region | Fourth region | — | — | 2.0 | 2.0 | — | — | 22.4 | 22.4 | 0.12 | 11000 | Comparative example |
| 5 | Third region | Third region | 5.4 | 5.4 | 2.1 | 2.1 | 24.2 | 24.2 | 24.0 | 24.0 | 0.17 | 25000 | Example |
| 6 | Third region | Third region | 5.7 | 5.7 | 2.3 | 2.3 | 24.1 | 24.1 | 24.1 | 24.1 | 0.19 | 28000 | Example |
| 7 | Third region | Third region | 5.8 | 5.8 | 2.4 | 2.4 | 24.0 | 24.0 | 24.3 | 24.3 | 0.20 | 30000 | Example |
| 8 | Third region | Third region | 6.5 | 6.5 | 3.0 | 3.0 | 23.9 | 23.9 | 25.0 | 25.0 | 0.25 | 37000 | Example |
| 9 | Third region | Third region | 6.3 | 6.3 | 2.6 | 2.6 | 24.1 | 24.1 | 24.7 | 24.7 | 0.22 | 33000 | Example |
| 10 | Third region | Third region | 6.4 | 6.4 | 2.8 | 2.8 | 24.2 | 24.2 | 24.8 | 24.8 | 0.23 | 35000 | Example |
| 11 | Third region | Third region | 6.1 | 6.1 | 2.5 | 2.5 | 24.1 | 24.1 | 24.4 | 24.4 | 0.15 | 25600 | Example |

Sample No. 1 was not subjected to the process of projecting the blasting solution to the untreated coating layer. In other words, Sample No. 1 was the coated tool in which the coating layer was merely deposited on the base. The fracture toughness value of the Ti-based coating layer in each of the first surface and the second surface was 2.6 MPa·m$^{0.5}$.

Sample No. 2 was one in which a blasting solution including angular ceramic particles was projected to the first surface and the second surface. Sample No. 2 had a slightly higher fracture toughness value of the Ti-based coating layer than Sample No. 1 not subjected to the process. The fracture toughness value in each of the first surface and the second surface was 3.4 MPa·m$^{0.5}$.

Samples Nos. 3 and 4 were ones in which a blasting solution including spherical zircon (ZrSiO$_4$) particles was projected to the first surface and the second surface. Samples Nos. 3 and 4 had a slightly higher fracture toughness value of the Ti-based coating layer than Sample No. 1 not subjected to the process. The fracture toughness value in each of the first surface and the second surface was 3.3 MPa·m$^{0.5}$ or 4.0 MPa·m$^{0.5}$.

All the fracture toughness values of the Ti-based coating layer in Samples Nos. 1 to 4 were low values.

In contrast, the Ti-based coating layers in Samples Nos. 5 to 11 that were the coated tools of the present disclosure included a region whose fracture toughness value was 10.0 MPa·m$^{0.5}$ or more or 14.0 MPa·m$^{0.5}$, thus leading to excellent fracture resistance.

An average circularity of each of the spherical Al$_2$O$_3$ particles in Samples Nos. 5 to 11, and an average circularity of the angular Al$_2$O$_3$ particles in Sample No. 2 were measured. Specifically, firstly, particle images were photographed with SEM, and projected areas (S) and circumferential lengths (L) of the particles were measured with image analysis software ("Mac-View Version. 4" manufacture by MOUNTECH Co., Ltd.). Then, circularity was calculated by applying an obtained measured value to equation: $4\pi S/L^2$. Circularities of arbitrarily selected 100 particles were calculated, and an average value thereof was an average circularity. Measurement results of the average circularity are as follows.

(Average Circularity)

The spherical Al$_2$O$_3$ particles in Samples Nos. 5 to 11: 0.90

The angular Al$_2$O$_3$ particles in Sample No. 2: 0.74

DESCRIPTION OF THE REFERENCE NUMERAL 1 coated tool
2 base
3 coating layer
4 surface
5 first surface
6 second surface
7 cutting edge
8 Ti-based coating layer
9 surface
10 Al$_2$O$_3$ layer
11 TiN layer (first TiN layer)
12 TiN layer (second TiN layer)
13 through hole
101 cutting tool
102 holder
102a first end
102b second end
103 pocket
104 screw

The invention claimed is:

1. A coated tool, comprising:
a base; and
a coating layer on the base,
the coated tool comprising a first surface, a second surface adjacent to the first surface, and a cutting edge on at least a part of a ridge part of the first surface and the second surface, wherein
the coating layer comprises:
a Ti-based coating layer, and
an Al$_2$O$_3$ layer on the Ti-based coating layer,
the Ti-based coating layer comprises:
a first region where a fracture toughness value of the Ti-based coating layer is 10 MPa·m$^{0.5}$ or more, and
a second region where the fracture toughness value is less than 10 MPa·m$^{0.5}$,
the fracture toughness value of the Ti-based coating layer is measured on a surface of the coating layer parallel to a surface of the base,
the second region is located 1 mm or more away from the cutting edge in directions along the first surface and the second surface, and
the first region extends from the cutting edge to the second region.

2. The coated tool according to claim 1, wherein hardness of the Ti-based coating layer in the first region is first hardness,
the hardness of the Ti-based coating layer in the second region is second hardness, and the first hardness is larger than the second hardness.

3. The coated tool according to claim 1, wherein the $Al_2O_3$ layer includes a third region where the fracture toughness value is 5 MPa·m$^{0.5}$ or more, wherein the third region is located above the first region.

4. The coated tool according to claim 3, wherein the $Al_2O_3$ layer includes a fourth region where the fracture toughness value is less than 5 MPa·m$^{0.5}$, wherein the fourth region is located above the second region and side by side to the third region.

5. A cutting tool, comprising:
a holder which has a length from a first end to a second end and comprises a pocket on a side of the first end; and
a coated tool in the pocket, the coated tool comprising:
  a base, and
  a coating layer on the base, wherein
the coated tool comprises a first surface, a second surface adjacent to the first surface, and a cutting edge on at least a part of a ridge part of the first surface and the second surface,
the coating layer comprises:
  a Ti-based coating layer, and
  an $Al_2O_3$ layer on the Ti-based coating layer,
the Ti-based coating layer comprises:
  a first region where a fracture toughness value of the Ti-based coating layer is 10 MPa·m$^{0.5}$ or more, and
  a second region where the fracture toughness value is less than 10 MPa·m$^{0.5}$,
the fracture toughness value of the Ti-based coating layer is measured on a surface of the coating layer parallel to a surface of the base,
the second region is located 1 mm or more away from the cutting edge in directions along the first surface and the second surface, and
the first region extends from the cutting edge to the second region.

6. The cutting tool according to claim 5, wherein the $Al_2O_3$ layer includes a third region where the fracture toughness value is 5 MPa·m$^{0.5}$ or more, wherein the third region is located above the first region.

7. The cutting tool according to claim 6, wherein the $Al_2O_3$ layer includes a fourth region where the fracture toughness value is less than 5 MPa·m$^{0.5}$, wherein the fourth region is located above the second region and side by side to the third region.

* * * * *